United States Patent
Obata et al.

(10) Patent No.: US 9,018,970 B2
(45) Date of Patent: Apr. 28, 2015

(54) METHOD OF TESTING PARTIAL DISCHARGE OF ROTATING ELECTRICAL MACHINE DRIVEN BY INVERTER

(75) Inventors: Koji Obata, Hitachi (JP); Yutaka Higashimura, Hitachi (JP); Keiji Suzuki, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 512 days.

(21) Appl. No.: 13/353,628

(22) Filed: Jan. 19, 2012

(65) Prior Publication Data

US 2012/0182040 A1 Jul. 19, 2012

(30) Foreign Application Priority Data

Jan. 19, 2011 (JP) .................................. 2011-008383

(51) Int. Cl.
*G01R 31/34* (2006.01)
*G01R 31/12* (2006.01)
*G01R 15/16* (2006.01)

(52) U.S. Cl.
CPC .............. *G01R 31/346* (2013.01); *G01R 15/16* (2013.01); *G01R 31/1272* (2013.01)

(58) Field of Classification Search
USPC ............ 324/765.01, 546, 528, 545, 551, 511, 324/553, 525, 536, 530; 318/800, 801, 802, 318/803, 804, 805; 310/68 R, 214, 215, 71, 310/364, 365
See application file for complete search history.

(56) References Cited

U.S. PATENT DOCUMENTS

| | | | | |
|---|---|---|---|---|
| 2,558,091 A | * | 6/1951 | Johnson | 324/546 |
| 4,814,699 A | * | 3/1989 | Koziel et al. | 324/765.01 |
| 6,114,871 A | * | 9/2000 | Shiota et al. | 324/765.01 |
| 6,452,416 B1 | * | 9/2002 | Kaneda et al. | 324/765.01 |
| 7,557,483 B2 | * | 7/2009 | Yasuhara et al. | 310/184 |
| 8,098,072 B2 | * | 1/2012 | Twerdochlib | 324/536 |
| 8,368,404 B2 | * | 2/2013 | Wakimoto et al. | 324/536 |
| 2005/0151658 A1 | | 7/2005 | Kono et al. | |
| 2006/0022679 A1 | | 2/2006 | Obata et al. | |

(Continued)

FOREIGN PATENT DOCUMENTS

| EP | 1 645 887 A2 | 4/2006 |
|---|---|---|
| JP | 7-49365 | 2/1995 |

(Continued)

OTHER PUBLICATIONS

Technical Specification, IEC/TS 60034-18-41, IEC 2006.
Technical Specification, IEC/TS 60034-18-42, IEC 2008.
European Search Report in EP 12000329, dated Oct. 25, 2013 (7 pgs.).

*Primary Examiner* — Huy Q Phan
*Assistant Examiner* — Thang Le
(74) *Attorney, Agent, or Firm* — Baker Botts, LLP

(57) ABSTRACT

In a rotating electrical machine, a conductive foil or conductive rubber is applied to the surface of insulation layer of a conductor series connection area or to the surface of insulation layer of a turn conductor of coils of rotating electrical machine winding, waveforms of grounding voltages of the individual turn conductor portions are measured through the medium of an electrostatic capacitance of the insulation layer of coil conductor series connection area or through the medium of the insulation layer of coil turn conductor, and a partial discharge is measured while measuring a voltage developing in the coil or across a winding turn in the coil from a difference between the waveforms of grounding voltages.

5 Claims, 10 Drawing Sheets

(56) References Cited

U.S. PATENT DOCUMENTS

2006/0152188 A1* 7/2006 Yasuhara et al. ............. 318/727
2007/0139056 A1 6/2007 Kaneiwa et al.

FOREIGN PATENT DOCUMENTS

| JP | 2002-365326 | 12/2002 |
|----|-------------|---------|
| JP | 2010-8199   | 1/2010  |

* cited by examiner

METHOD OF TESTING PARTIAL DISCHARGE OF ROTATING ELECTRICAL MACHINE DRIVEN BY INVERTER

BACKGROUND OF THE INVENTION

The present invention pertains to the technical field of inverter driven rotating electrical machines and more particularly, relates to a method of testing partial discharge in a rotating electrical machine driven by an inverter.

In recent years, variable speed running of a rotating electrical machine using an inverter has been put into practice extensively from the standpoint of economization of energy. But reports have been made on various problems raised in connection with insulation of the rotating electrical machine driven by the inverter (see the technical report of the Institute of Electrical Engineers of Japan, pp. 12 to 20, Vol. 739 (non-patent literature 1), for instance). The report is made on, for example, the fact that when an inverter surge voltage generated by ON/OFF of switching elements inside the inverter propagates through a cable to reach the end terminal of the rotating electrical machine, a mismatching of surge impedance between the cable and the rotating electrical machine becomes responsible for causing the inverter surge voltage to jump up to twice its original level at the rotating electrical machine end terminal. Another report has also been made on the fact that when a steep inverter surge voltage migrates into the rotating electrical machine, a high voltage is generated in the outlet coil of rotating electrical machine and/or across its internal winding turn. For these reasons, it is necessary that in the inverter driven rotating electrical machine, the machine should be so designed in insulation as to be durable against these inverter surge voltages and besides a product of rotating electrical machine should be given an inspection as to whether it has predetermined inverter surge insulation proof stress.

As one of methods for inspecting the insulation of inverter driven rotating electrical machine, an insulation inspection method using an impulse voltage has been carried out (see JP-A-2010-8199 and, IEC 60034-18-41 and IEC 60034-18-42 (non-patent literatures 2 and 3)). Particularly, in the non-patent literatures 2 and 3, an impulse voltage is applied to a rotating electrical machine to generate a voltage in the outlet coil of the rotating electrical machine or across its internal winding turn for the purpose of measuring a partial discharge. The literatures describe that this process uses an impulse voltage having the same voltage rise-up time as that of the inverter voltage applied to the rotating electrical machine upon start of inverter drive of the rotating electrical machine.

SUMMARY OF THE INVENTION

However, the voltage rise-up time an impulse power supply actually put on sale has is constant and therefore, it was difficult to constantly generate impulse voltages having the same voltage rise-up times as those of various inverter voltages and to apply the generated impulse voltages to the rotating electrical machine. Further, in a large scale rotating electrical machine, a large electrostatic capacitance (circuit element having its impedance rendered small for high frequencies) exists between the rotating electrical machine winding and ground, giving rise to a problem that even when an impulse power supply capable of generating an impulse voltage having a predetermined voltage rise-up time upon no loading is prepared, high-frequency components of an output voltage the rotating electric machine connects to are attenuated and only an impulse voltage having gradual voltage rise-up time is applied to the rotating electrical machine.

Further, the results of various studies have proven the occurrence of such a problem that even with the rotating electrical machine applied with an impulse voltage having the same voltage rise-up time as that of the inverter voltage, the same voltage as that upon start of driving the inverter can not always be generated across a winding turn of the rotating electrical machine and the test of a partial discharge across the winding turn cannot be conducted correctly. More specifically, in the past, it has been presumed that when a black box of a rotating electrical machine is set up and an impulse voltage having the same voltage rise-up time as that of the inverter voltage is applied to the rotating electrical machine, the impulse voltages will be distributed equally as the inverter voltages inside the rotating electrical machine are distributed but actually, due to the fact that an inverter voltage waveform complicated by being accompanied by high-frequency vibrations differs at a voltage rise-up portion from the impulse voltage of triangular or rectangular waveform type, an inverter voltage of the same magnitude cannot always be generated across a winding turn, resulting in shortage or surplus of voltage which brings about such a problem that measuring a partial discharge across a winding turn correctly by generating the same voltage as that upon start of driving the inverter cannot be achieved.

To solve the above problems, it is conceivable to eliminate insulation for rotating electrical machine winding so as to connect an electrode for voltage distribution measurement directly to a strand conductor and measure a partial discharge while measuring a voltage distribution. In an actual product for shipment, however, attaching the electrode for voltage distribution measurement by removing the insulation cannot be carried out and so, the aforementioned expedient is unrealistic. Especially, in a rotating electrical machine manufactured by totally impregnating varnish, the varnish impregnates to details and adhered rigidly thereto, giving rise to a problem that removal of the insulation from a particular spot fails and the insulated portion of the product is damaged. In the case of a few kinds of rotating electrical machines to be mass-produced, the above problem can be coped with by sampling a plurality of lots of rotating electrical machines, by measuring a voltage distribution and by correcting a test voltage but the above method cannot be practiced in the case of many kinds of rotating electrical machines to be produced in small quantity. It can otherwise be considered that on the basis of the recently developing analytical technologies, a voltage distribution resulting from application of the complicated inverter voltages is compared to that resulting from application of the impulse voltages and the impulse voltage is corrected for its magnitude on the basis of the results of comparison. But constants used for the analysis are determined by using a design drawing and therefore, the usage of the constants in a test for inspecting an actual product for its manufacture completeness meeting the design drawing leads to an apprehension of deviating from the originally essential object of the test.

In view of the problems as above, the present invention provides a method of measuring correctly a partial discharge across a winding turn by generating a voltage having the same magnitude as that of a voltage applied, upon starting an inverter, across the winding turn of a rotating electrical machine and to provide an inverter driven rotating electrical machine capable of assuring its proper quality by using the method.

The above problems can be solved by a method according to the present invention as below. More particularly, in an impulse partial discharge testing method according to the present invention, an electrode made of a conductive foil or conductive rubber is applied to the surface of insulation layer of a conductor series connection (joint) spot of coils of rotating electrical winding or to the surface of insulation layer of a turn conductor of the coil, a waveform of grounding voltage of each of the turn conductors is measured through the medium of an electrostatic capacitance Cx of the insulation layer of coil conductor series connection area or of the insulation layer of coil turn conductor and a partial discharge is measured while measuring voltages generated in the coil and across the winding turn from a difference between the waveforms of grounding voltages.

Especially, in the method, the electrode is placed on the surface of insulation layer of the conductor series connection area of coils of rotating electrical machine or on the surface of insulation layer of the turn conductor of the coil, waveforms of grounding voltage of each of the turn conductor spots is measured through the medium of an electrostatic capacitance Cx of the insulation layer of the coil conductor series connection area or through the medium of the insulation layer of the coil turn conductor, voltages generated in the coil and across a winding turn in the coil are measured from the difference between waveforms of grounding voltages and on the basis of the measured voltages, the magnitude of an impulse test voltage corresponding to a predetermined voltage applied across the winding turn is determined so as to measure a partial discharge, so that an impulse partial discharge test for the inverter driven rotating electrical machine can be conducted efficiently.

Further, in the course of the impulse partial discharge test as above, a capacitor is connected in series with an electrostatic capacitance of the insulation layer of coil conductor series connection area and ground or capacitors are connected in series with electrostatic capacitances of insulation layer of coil turn conductor and ground, waveforms of grounding voltages applied to the series capacitors are measured, which in turn are converted to waveforms of grounding voltages generated in winding by using a voltage division ratio determined through a separate measurement from a ratio $\alpha x$ between electrostatic capacitance Cx of the insulation layer and electrostatic capacitance $C_x'$ of the series capacitors and a partial discharge is measured from a difference between the waveforms of grounding voltages while measuring voltages applied to the coil and applied across a winding turn in the coil, thus reducing the influence the ambience conditions such as stray capacitances have.

Especially, in this case, a capacitor is connected in series with an electrostatic capacitance of the insulation layer of coil conductor series connection area and ground or a capacitor is connected in series with an electrostatic capacitance of the insulation layer of coil turn conductor and ground, waveforms of grounding voltages applied to the series capacitors are measured, which in turn are converted to waveforms of grounding voltages generated in winding by using a voltage division ratio $\alpha x$ determined through a separate measurement from electrostatic capacitance Cx of the insulation layer and electrostatic capacitance $C_x'$ of the series capacitors, voltages applied to the coil and the winding turn in the coil are measured and on the basis of the measured voltages, the magnitude of impulse test voltage corresponding to a predetermined voltage across the winding turn is determined to thereby measure a partial discharge, so that an impulse partial discharge test for the inverter driven rotating electrical machine can be conducted efficiently.

Further, for the capacitor connected in series with an electrostatic capacitance of the insulation layer of coil conductor series connection area and ground or connected in series with an electrostatic capacitance of the insulation layer of coil turn conductor and ground, capacitors having electrostatic capacitances $C_1'$, $C_2'$ ... $C_n'$ having each a constant ratio $\alpha$ to the electrostatic capacitances $C_1, C_2 ... C_n$ of the insulation layer of coil conductor series connection area or of the insulation layer of coil turn conductor are used and when carrying out a partial discharge test, a difference between waveforms of grounding voltages generated in the capacitors having the electrostatic capacitances $C_1'$, $C_2'$ ... $C_n'$ is determined, voltages generated in the coil and across a winding turn in the coil are determined on the basis of the electrostatic capacitance ratio $\alpha$ and while measuring the voltages, a partial discharge can be measured.

Especially, at that time, for the capacitor connected in series with an electrostatic capacitance of the insulation layer of coil conductor series connection area and ground or connected in series with an electrostatic capacitance of the insulation layer of coil turn conductor and ground, capacitors having electrostatic capacitances $C_1', C_2' ... C_n'$ having each a constant ratio $\alpha$ to the electrostatic capacitances $C_1, C_2 ... C_n$ of the insulation layer of coil conductor series connection area or of the insulation layer of coil turn conductor are used and when conducting a partial discharge test, a difference between waveforms of grounding voltages generated in the capacitors having the electrostatic capacitances $C_1', C_2' ... C_n'$ is determined and voltages generated in the coil and across a winding turn in the coil are determined on the basis of the electrostatic capacitance ratio $\alpha$ and then, on the basis of the measured voltages, the magnitude of impulse test voltage corresponding to a predetermined voltage across the winding turn is determined to thereby measure a partial discharge, so that an impulse partial discharge test for the inverter driven rotating electrical machine can be conducted efficiently.

To add, the voltage measurement error can be suppressed from increasing by using, for the capacitor connected between the insulation layer of coil conductor series connection area and ground or between the insulation layer of coil turn conductor and ground, an electrostatic capacitance of $C_x'$ which is 10 times or more a stray capacitance of a voltage measuring probe and which satisfies the relation $$C_x' < (PDIV) \cdot C_x / (V_{imp} - (PDIV))$$

where (PDIV) represents a partial discharge initiation voltage when the electrode is placed on the surface of insulation layer of the coil conductor series connection area or the surface of insulation layer of the coil turn conductor.

The inverter driven rotating electrical machine assuring the suitable quality according to the invention can be materialized by manufacture of a rotating electrical machine applied with testing of a partial discharge across a winding turn through the impulse voltage partial discharge test process and by the inspection process.

According to this invention, by generating, across a winding turn of the rotating electrical machine, a voltage having the same magnitude as that of a voltage upon start of inverter drive across a winding turn of the rotating electrical machine, a partial discharge across the winding turn can be measured correctly. Further, according to the present method, an inverter driven rotating electrical machine assuring suitable quality can be provided.

Other objects, features and advantages of the invention will become apparent from the following description of the embodiments of the invention taken in conjunction with the accompanying drawings.

DESCRIPTION OF THE EMBODIMENTS

Embodiments of the present invention will now be described with reference to the accompanying drawings.
[Embodiment 1]

Figure 1:
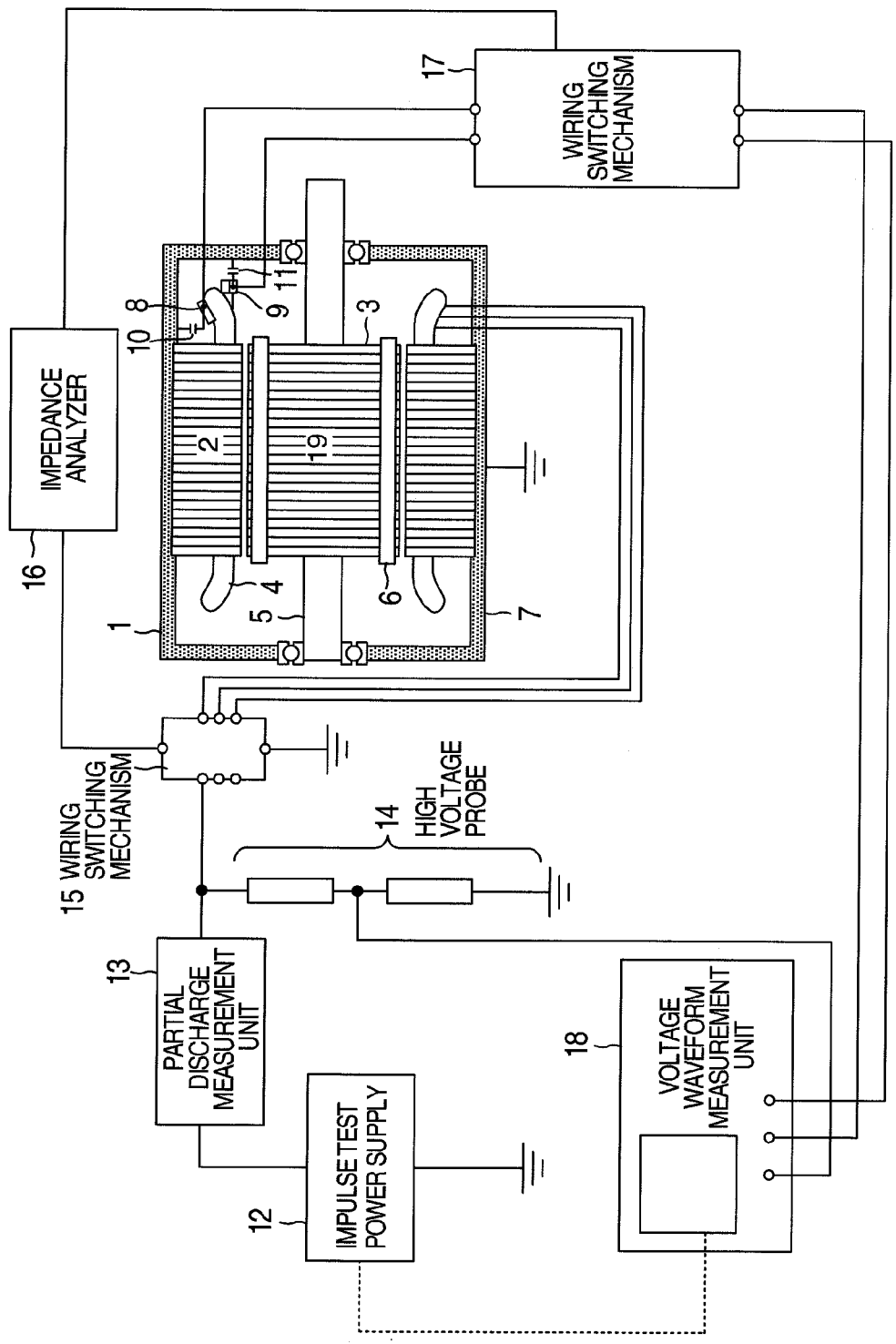
FIG. 1 is a block diagram illustrative of a method for measuring an impulse partial discharge across a winding turn and a rotating electrical machine according to embodiment 1 of the invention.

Referring first to FIG. 1, embodiment 1 of this invention is constituted as shown therein. A rotating electrical machine 1 representing a measurement objective is constructed of a stator 2 and a rotor 3. A stator winding 4 is wound on the stator 2 and a revolving magnetic field is generated by passing electric currents through the stator winding 4. On the other hand, the rotor 3 has its shaft 5 to which the rotor core 19 is fixedly connected. In the case of the rotating electrical machine being an induction motor, a rotor coil assembly 6 of squirrel-cage type or wound-rotor type is incorporated. In the case of a synchronous motor, on the other hand, a field coil substitutes for the rotor coil 6. Further, in the case of a permanent magnet synchronous motor without resort to the use of a coil, a permanent magnet is used in place of the rotor coil assembly 6. The stator 2 and rotor 3 are built in a housing 7. In embodiment 1, a metal foil electrode 9 adapted for a series insulation layer is applied to the surface of a coil conductor series connection area at the end of stator coil 4 and a metal foil electrode 8 adapted for a turn conductor is applied to the surface of an insulation layer of turn conductor and in addition, a capacitor 11 is connected in series with an electrostatic capacitance of the series insulation layer and then, a capacitor 10 is connected in series with an electrostatic capacitance of the turn conductor insulation layer.

Connected to the rotating electrical machine 1 representing the measurement objective is an impedance analyzer 16 via a wiring switching mechanism 15 arranged on the input side of rotating electrical machine and via a wiring switching mechanism 17 on the metal foil electrode side to ensure that electrostatic capacitances the insulation layer of coil conductor series connection area of rotating electrical machine winding 4 and the insulation layer of coil turn conductor have can be measured. Also connected to the rotating electrical machine 1 representing the measurement objective are an impulse test power supply 12 and a partial discharge measurement unit 13 by way of the wiring switching mechanism 15 so that a partial discharge may be measured by applying an impulse voltage. Further, the rotating electrical machine 1 representing the measurement objective is connected with a voltage waveform measurement unit 18 through the wiring switching mechanism 17 on the metal foil electrode side in order that waveforms of grounding voltages of the individual components can be measured through electrostatic capacitances of the insulation layer associated with the coil conductor series connection area or with the coil turn conductor. Then, an operation processing mechanism not shown in the voltage waveform measurement unit 18 calculates a ratio $\alpha_x$ between an electrostatic capacitance $C_x$ of the insulation layer and an electrostatic capacitance $C_x{}'$ of a capacitor serially connected to the capacitance $C_x$ and determines, from the ratio, a share of taking partial charge of voltage based on which the operation processing mechanism converts the measured voltage waveforms to waveforms of grounding voltages actually applied to the winding, so that a partial discharge can be measured while monitoring a voltage developing across a winding turn during measurement of impulse voltage partial discharges. Further, structurally, on the basis of a ratio between the magnitude of a measured voltage across the winding turn and the magnitude of an applied impulse voltage, the magnitude of an impulse test voltage is determined such that the voltage applied across the winding turn exhibits a predetermined value and then, a command value of test voltage is transmitted to the impulse test power supply 12. It is to be noted that an impulse test voltage waveform applied to the rotating electrical machine is measured by the voltage waveform measurement unit by way of a high voltage probe 14.

The constitution of the impulse partial discharge measurement in the rotating electrical machine according to embodiment 1 has been described as above by way of example of the rotating electrical machine 1 incorporating the rotor 3 as shown in FIG. 1. But even in the absence of rotor 3 and in the presence of stator 2 alone, the present test can be conducted.

Figure 2:
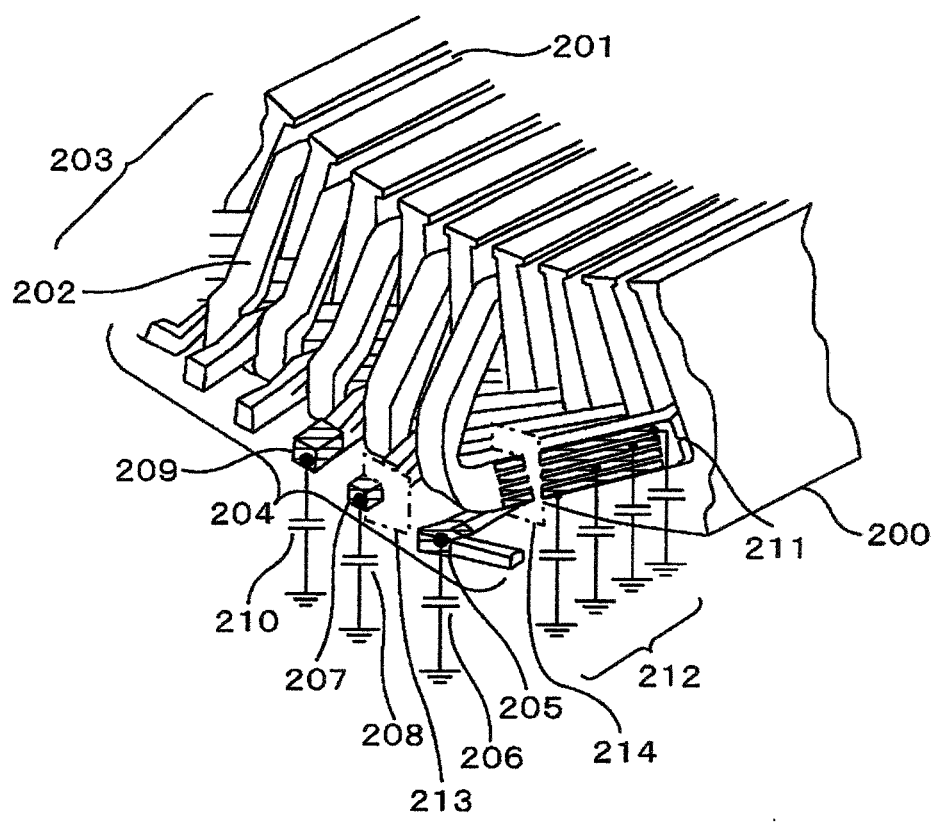
FIG. 2 is a fragmentally perspective view of a coil end portion of the rotating electrical machine in embodiment 1.

Turning to FIG. 2, the end of stator winding 4 of rotating electrical machine 1 shown in FIG. 1 is illustrated as viewed in a direction oblique to the shaft. In FIG. 2, the rotor 3 in FIG. 1 is not illustrated for simplicity of illustration. In a core 200 of stator 2, a plurality of slots 201 are formed which accommodate coils 202 constituting a rotating electrical machine winding and a plurality of coils are fitted in the slots. The plural coils are mutually connected at series connection (joint) spots 204 in a coil end portion 203. The series connection area is wound with an insulating tape or insulating sheet so as to be insulated from the peripheral portion. In embodiment 1, wound around the surface of the insulation layer the series connection area has are a metal foil electrode 205 applied to the series connection insulation spot of a first coil on the rotating electrical machine outlet side, a metal foil electrode 207 applied to a second coil on the machine outlet side and a metal foil electrode 209 applied to a third coil on the machine outlet side. Then, connected across the metal foil electrode and ground on the machine outlet side are a series capacitor 206 on the first coil series connection area insulation layer, a series capacitor 208 on the second coil series connection area insulation layer and a series capacitor 210 on the third coil series connection area insulation layer. On the other hand, to the coil of rotating electrical machine winding, especially, to the outlet side coil portion, metal foil electrodes 211 opposing the turn conductors of coil are applied at positions confronting the turn conductors, respectively, and capacitors 212 in association with the respective turn conductors are connected in series with the respective electrodes 211 and ground.

Figure 3:
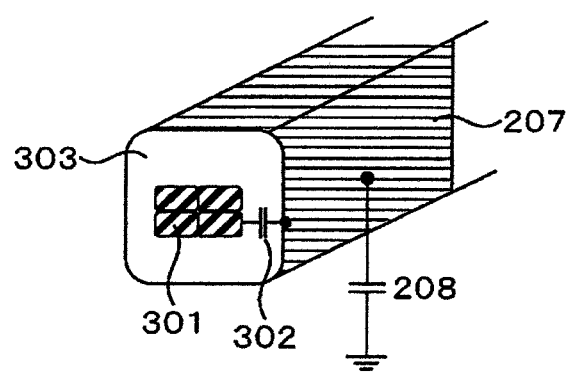
FIG. 3 is a fragmentally perspective cross-sectional view of a coil series connection area.

The coil series connection area in FIG. 2 is cross-sectioned at 213 to show a cross-sectional structure as illustrated in FIG. 3. In embodiment 1, a conductor of single coil consists of 2 strands and two sets of the 2 strands are put together at the series connection area and therefore, a coil conductor 301 is composed of 4 strands in total. An insulation layer 303 is wound about the outer periphery of the set of strands. Further, on the surface of the insulation layer 303 of series connection area, the metal foil electrode 207 is placed in association with the series connection area insulation layer. As a result, across the coil conductor 301 and the metal foil electrode 207 on the second coil series connection area insulation layer applied on the rotating electrical machine outlet side, an electrostatic capacitance 302 of the insulation layer is formed. In embodiment 1, the capacitor 208 is additionally connected in series with the metal foil electrode 207 on series connection area insulation layer and ground as described previously.

Figure 4:
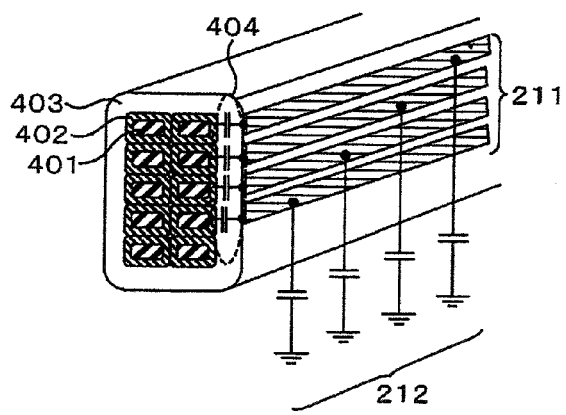
FIG. 4 is a fragmentally perspective cross-sectional view of a coil turn conductor portion.

The coil conductor in FIG. 2 is cross-sectioned at 214 to show a cross-sectional structure as illustrated in FIG. 4. In the rotating electrical machine in embodiment 1, the coil conductor is constructed of conductor strands 401 stacked in 2 rows and 5 lines on cross-sectional plane. Strands adjoining in lateral direction are connected in parallel externally of the coil to assume the same potential. On the other hand, vertically adjoining strands form turns of coil, respectively, and in the coil of embodiment 1, five turns are formed. The outer periphery of the conductor strand 401 is wound with a turn insulation 402 and in the event that a steep inverter voltage is applied to the rotating electrical machine, a large voltage is generated in a turn insulation portion adapted to provide insulation between adjacent turns. Each turn conductor of coil constituted by 2 conductor strands is associated with the metal foil electrode 211 opposing thereto and an outer peripheral electrostatic capacitance 404 is formed by an outer peripheral insulation 403 adapted to insulate the outer periphery of the coil conductor assembly. Further, as described previously, in the case of embodiment 1, the respective capacitors 212 are connected in series with the respective metal foil electrodes 211 opposing the turn conductors and ground.

Figure 5:
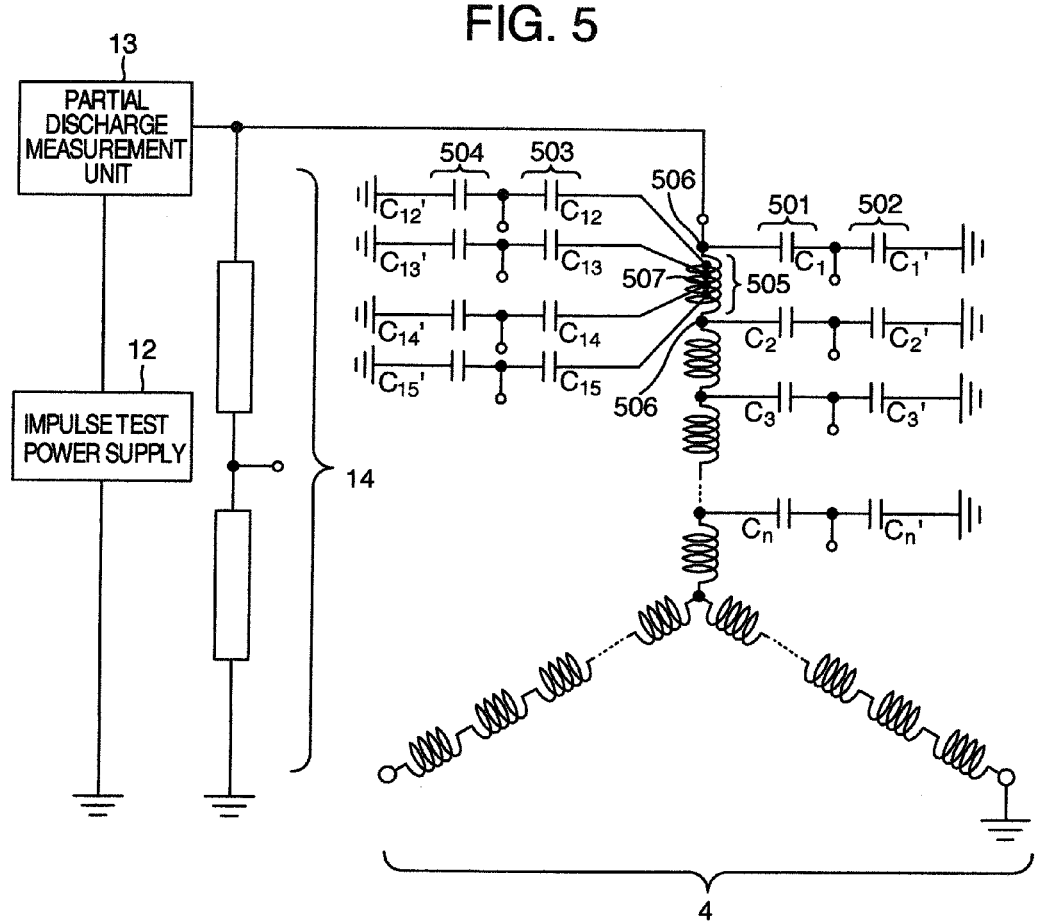
FIG. 5 is an equivalent circuit diagram illustrative of the method for measuring an impulse partial discharge across a winding turn and illustrative of the rotating electrical machine in embodiment 1.

Illustrated in FIG. 5 is an equivalent circuit diagram of the rotating electrical machine in embodiment 1. In embodiment 1, the metal foil electrode is applied to the surface of insulation layer of a coil conductor series connection area 506 at which serially connected coils 505 mutually meet and the metal foil electrodes are also applied to the surface of insulation layer of a coil turn conductor 507 in the coil, so that an electrostatic capacitance 501 ($C_1, \ldots$ or $C_n$) is formed in association with each of the spots 506 and electrostatic capacitances 503 ($C_{12}$ to $C_{15}$) are formed in association with the respective coil conductors. Further, in series with each of the electrostatic capacitances, a series capacitor 502 ($C_1', \ldots$ or $Cn'$) associated with the electrostatic capacitance of coil series connection area insulation layer and a series capacitors 504 ($C_{12}', \ldots$ or $C_{1n}'$) associated with the electrostatic capacitance of coil turn conductor insulation layer are connected. The series capacitor 502 in association with the electrostatic capacitance of coil series connection area insulation layer is caused to take partial charge of a voltage through the medium of the electrostatic capacitance 501 the coil series connection area insulation layer has, or the series capacitor 504 in association with the electrostatic capacitance of coil turn conductor insulation layer is caused to take partial charge of a voltage through the medium of the electrostatic capacitance 503 the coil turn conductor insulation layer has and, under this condition, waveforms of grounding voltages generated in the individual portions of rotating electrical machine winding under application of impulse voltages to the machine by means of the impulse test power supply 12 are measured and while monitoring constantly or temporarily a voltage applied across a winding turn on the basis of the thus measured voltage waveform, a predetermined voltage is generated across the winding turn so as to measure a partial discharge across rotating armature winding turn by means of the partial discharge measurement unit 13. It is to be noted that the applied impulse test voltage can be measured concurrently by means of the high voltage probe 14.

Figure 7:
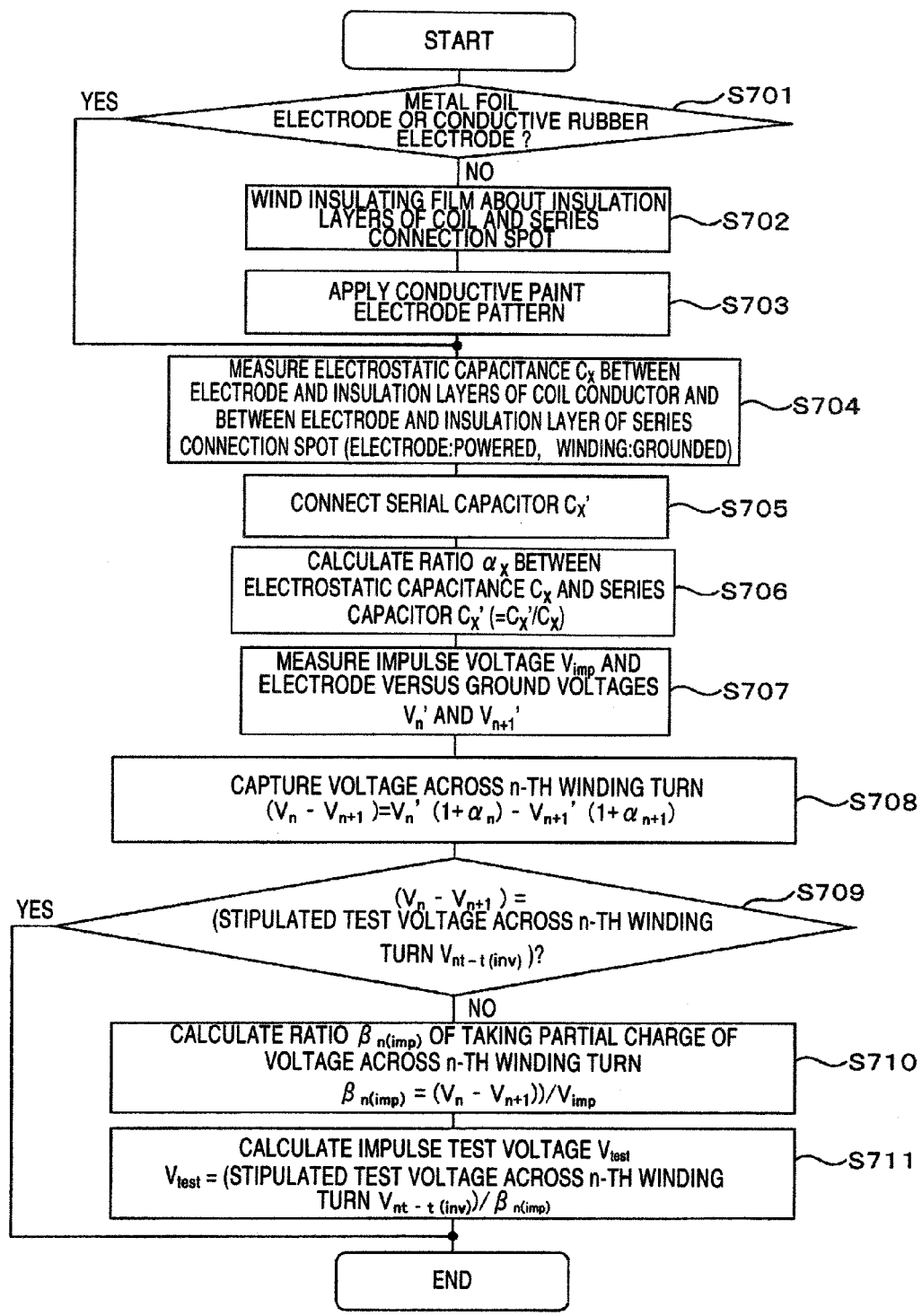
FIG. 7 is a flowchart of the method for measuring an impulse partial discharge across a winding turn.

The machine construction in embodiment 1 of the invention has been set forth so far and now, procedures for testing will be described by making reference to a flowchart. Illustrated in FIG. 7 is the flow of testing impulse partial discharges. Firstly, the metal foil electrodes explained in connection with FIGS. 1 to 5 are placed on the surface of insulation layer of the coil conductor series connection area and on the surface of insulation layer of coil turn conductors. In this phase, with a view to promote contact intimacy between the metal foil electrode and the insulation layer surface, the metal foil electrode is preferably pressed externally thereof through the medium of a soft member made of, for example, rubber. Alternatively, by interposing such materials as Vaseline (petroleum) or grease removable easily afterward between the metal foil and the insulation layer, the intimacy of contact can be promoted. Apart from the above, in place of pressing the metal foil externally thereof, a conductive rubber electrode can be used from the beginning. If the formation of the electrode as above is possible, the program proceeds to step S704 in the flow. But in case execution of the above method is difficult to proceed or a problem of concentration of an electric field to the edge of the metal foil arises, a method may be adopted in which an insulating film is wound around the surface of insulation layer of coil conductor series connection area and of the insulation layer of coil turn conductors and an electrode pattern is drawn on the film with conductive paint. In this case, the electrode end can be treated as impersonating a diverging electrode and so, the resistive electric field can be mitigated to prevent electric field concentration.

Next, wiring of the grounding terminal of impedance analyzer 16 in FIG. 1 is connected to any one or all of U, V and W three-phase outlets of the rotating electrical machine coils by way of the wiring switching mechanism 15 on the machine input side, and the power loading side of impedance analyzer 16, on the other hand, is connected to the individual metal foil electrode portions by way of the wiring switching mechanism 17 connected on the machine input metal electrode side and thereafter, electrostatic capacitances Cx of the insulation layer of coil conductor series connection area and of the insulation layer of coil turn conductor are measured. Subsequently, a series capacitor $C_x'$ is connected between the metal foil electrode of each spot and ground. Accordingly, an electrostatic capacitance ratio $\alpha_x'$ between the measured insulation layer electrostatic capacitance $C_X$ and the electrostatic capacitance $C_x'$ of series capacitors can be determined. Next, with the help of the wiring switching mechanism 15 on the rotating electrical machine input side, the impedance analyzer is disconnected from the rotating electrical machine in FIG. 1 and a voltage output of impulse test power supply 12 is connected to any of U, V and W three phases of rotating electrical machine through the partial discharge measurement unit 13. Since, in embodiment 1, the partial discharge measurement unit 13 of the type connected in series with the impulse test power supply 12 and with the rotating electrical machine 1 is used and besides, a voltage drop inside the partial discharge measurement unit 13 is small, a voltage substantially equal to the output of impulse test power supply 12 can be applied to the rotating electrical machine by way of the output of partial discharge measurement unit 13. On the other hand, with the help of the wiring switching mechanism 17 on the metal foil electrode side, the electrodes applied to the surface of insulation layer of the coil conductor series connection area and to the surface of insulation layer of the coil turn conductor are disconnected from the impedance analyzer and then connected to the voltage waveform measurement unit 18 through a voltage measuring probe not shown. Next, an impulse voltage is outputted from the impulse power supply and a waveform of the impulse voltage $V_{imp}$ and waveforms of grounding voltages $V_n'$ and $V_{n+1}'$ at the plurality of electrodes applied to the surface of insulation layer of the coil conductor connection series spot and to the surface of insulation layer of the coil turn conductor of rotating electrical machine winding are measured. By using the thus measured voltage waveforms and the voltage division ratios $\alpha_n$ and $\alpha_{n+1}$ obtained by the capacitances of the individual electrodes determined in advance, waveforms of grounding voltages of the individual turn conductors are determined and besides, by calculating the difference between the voltage waveforms by means of an inside operation mechanism of voltage waveform measurement unit 18, a voltage across the n-th winding turn can be captured.

If the voltage across the n-th winding turn differs from the stipulated test voltage $V_{nt-t\,(inv)}$ across the n-th winding turn, a peak to peak voltage of the captured voltage across the n-th winding turns is divided by a peak voltage $V_{imp}$ of the loaded impulse voltage so as to determine a ratio of taking partial charge of or sharing the voltage across the n-th winding turn. By dividing the stipulated test voltage $V_{nt-t(inv)}$ across the n-th winding turn settled by test specifications by the ratio $\beta_{n\,(imp)}$ of taking partial charge of impulse voltage, an impulse test voltage $V_{test}$ necessary for the partial discharge test across the winding turn in the inverter driven rotating electrical machine can be determined and by conducting the measurement of a partial discharge across the winding turn of the objective rotating electrical machine through the use of that voltage, the presence/absence of partial discharge generated across the winding turn when the rotating electrical machine is driven by the inverter and the conditions of generation as well can be measured. It is to noted that after completion of the test for all the electrodes, the plurality of electrodes applied to the surfaces of individual insulation layers of the coil conductor series connection areas and to the surface of insulation layer of the coil turn conductors are removed and the rotating electrical machine can be shipped.

Figure 6:
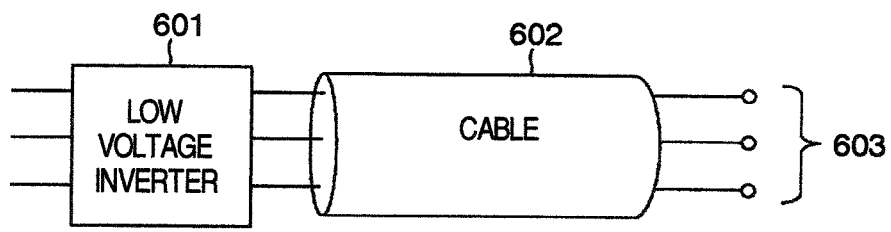
FIG. 6 is a diagram schematically illustrating an inverter voltage waveform generator.

In connection with FIG. 7, the test flow has been explained when the stipulated test voltage $V_{nt-t(inv)}$ across the n-th winding turn is settled in advance by test specifications. But, by making reference to FIG. 8, an explanation will be given to a test flow of determining a test voltage across the n-th winding turn when the stipulated test voltage $V_{nt-t(inv)}$ across the n-th winding turn is not settled. Since steps ranging from applying the electrodes onto the rotating electrical machine (S801) to determining the voltage division ratio by electrostatic capacitances (S806) are the same as those explained previously in connection with FIG. 7, these steps will not be described herein. Then, in FIG. 8, a power supply for the inverter voltage or for simulating it substitutes for the impulse test power supply 12 and partial discharge measurement unit 13 as well in order to apply an inverter voltage to the three phases U, V and W of rotating electrical machine coil by way of the wiring switching mechanism 15 on the rotating electrical machine input side. Even without using an actual high voltage inverter, an inverter voltage can be prepared by using an output 603 of low voltage inverter 601 and cable 602 as shown in FIG. 6. Further, for the power supply imitating an inverter voltage, an arbitrary low voltage waveform generator can be used. When the inverter voltage is applied, a waveform of inverter voltage $V_{inv}$ is measured and besides, waveforms of grounding voltages $V_n'$ and $V_{n+1}'$ of a plurality of electrodes applied, at that time, to the surface of the insulation layer of coil conductor series connection area and of the insulation layer of coil turn conductor of the machine winding in the rotating electrical machine are also measured. By determining waveforms of grounding voltages of the conductors at the individual spots through the use of the measured voltage waveforms and the previously determined capacitance voltage division ratios $\alpha_n$ and $\alpha_{n+1}$ and then, by causing the operation mechanism in the voltage waveform measurement unit 18 to calculate the difference between the voltage waveforms, a voltage across the n-th winding turn can be captured. Further, by dividing a peak to peak voltage of the thus captured voltage across the n-th winding turn by a peak voltage $V_{inv}$ of a loaded inverter voltage, a ratio $\beta_{n(inv)}$ of taking partial charge of or sharing a voltage across the n-th winding turn can be determined. By multiplying a steep change amount of grounding voltage $\Delta V_g$ generated at the end of inverter driven rotating electrical machine by the ratio $\beta_{n(inv)}$ of taking partial charge of inverter voltage, a stipulated test voltage across the n-th winding turn $V_{nt-t(inv)}$ can be determined. It will be appreciated that in case the steep voltage change amount of grounding voltage $\Delta Vg$ generated at the end of inverter driven rotating electrical machine is described in the ordering specifications, this value can be used but if it is not described, a steep voltage change amount $\Delta Vg$ of an interphase voltage generated at the end of inverter driven rotating electrical machine can substitute for the described value.

Through the above method, a partial discharge across a winding turn can be measured correctly by using an impulse voltage waveform different from the inverter voltage waveform and by applying across the winding turn a suitable voltage equivalent to that upon start of inverter drive. Also, by using the present method, an inverter driven rotating electrical machine assured of proper quality can be provided.

From the standpoint of general applicability, embodiment 1 has been described by way of the example where an arbitrary value is taken as the ratio $\alpha_X$ between the electrostatic capacitance $C_X$ of electrostatic capacitor 501 the coil series connection area insulation layer has or the electrostatic capacitance $C_X$ of electrostatic capacitor 503 the coil turn conductor portion insulation layer has and the series capacitors 502 associated with the electrostatic capacitance of coil series connection area insulation layer or of the series capacitors 504 associated with the electrostatic capacitance of coil turn conductor insulation layer. But, by adjusting the value of electrostatic capacitance $C_x'$ of the respective series capacitors to a constant value $\alpha_{constant}$ and calculating directly the difference between waveforms of grounding voltages measured in connection with the respective series capacitors and then, by multiplying the thus calculated difference by $(1+\alpha_{const})$, a voltage generated across a winding turn can be determined. By doing so, the waveform operation in step S708 of FIG. 7 and in step S808 of FIG. 8 can be simplified and the partial discharge measurement can be conducted on real time base while monitoring the voltage generated across the winding turn.

Figure 14:
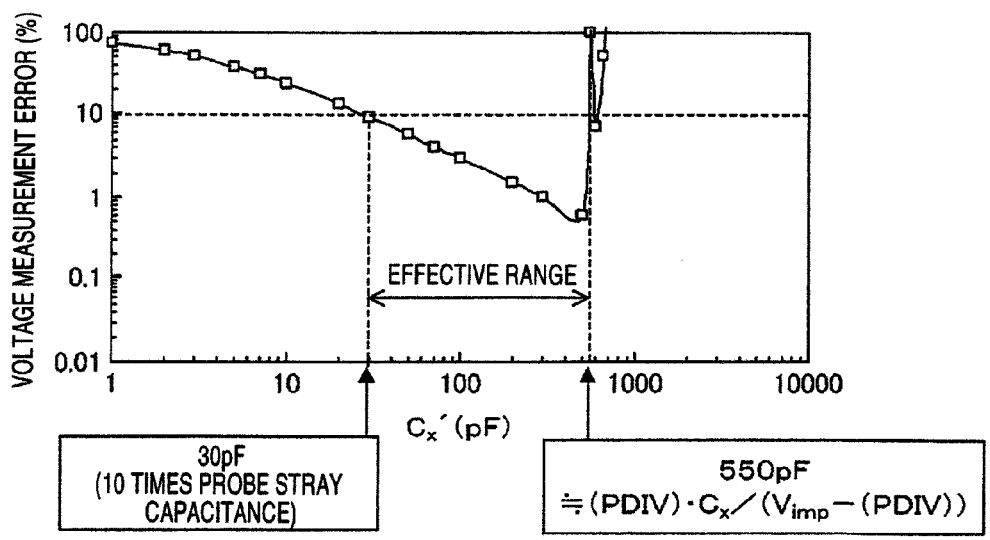
FIG. 14 is a graphical representation illustrative of errors in measurement of voltages which develop when the value of $C_x{}'$ is changed.

The value of electrostatic capacitance $C_x'$ of the series capacitor used in embodiment 1 is related to the voltage measurement error as graphically illustrated in FIG. 14. Generally, stray capacitances coexist with the voltage waveform measurement unit 18 in FIG. 1 and with the voltage measurement probe attached thereto. Accordingly, if the value of electrostatic capacitance of the series capacitors is small, the ratio $\alpha_X$ between the electrostatic capacitance $C_X$ of insulation layer and the electrostatic capacitance $C_x'$ of the series capacitors becomes incorrect and the voltage measurement error increases. Taking in mind the fact that the insulation inspecting test method described in non-patent literatures 1 and 2 considers a safety ratio of 10% concomitant with voltage variations, the value of $C_x'$ must be 10 times or more that for the voltage measurement probe in order to similarly prevent the voltage measurement error from exceeding 10% in FIG. 14.

On the other hand, as the value of $C_x'$ increases, partial discharges are generated in the insulation layer of coil conductor series connection area and in the insulation layer of coil turn conductor and besides, in an air gap between the electrode and the insulation layer, giving rise to a problem that the measured voltage is varied by the partial discharge, causing the error to diverge. More specifically, a small gap exists between the insulation layer 303 of coil series connection area and the metal foil electrode 207 applied onto the series connection area insulation layer. Also, a small gap exists between the outer peripheral insulation 403 and the metal foil electrodes 211 respectively opposing the turn conductors in FIG. 4.

Figure 15:
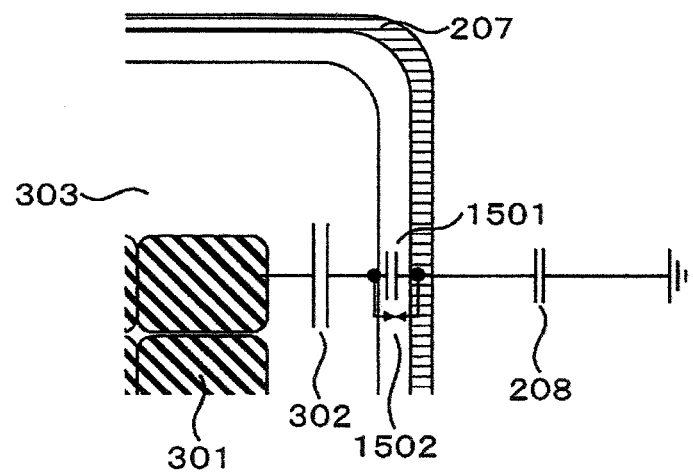
FIG. 15 is an enlarged fragmentally cross-sectional view illustrative of a gap between a foil electrode and an insulation layer in FIG. 3.
Figure 16:
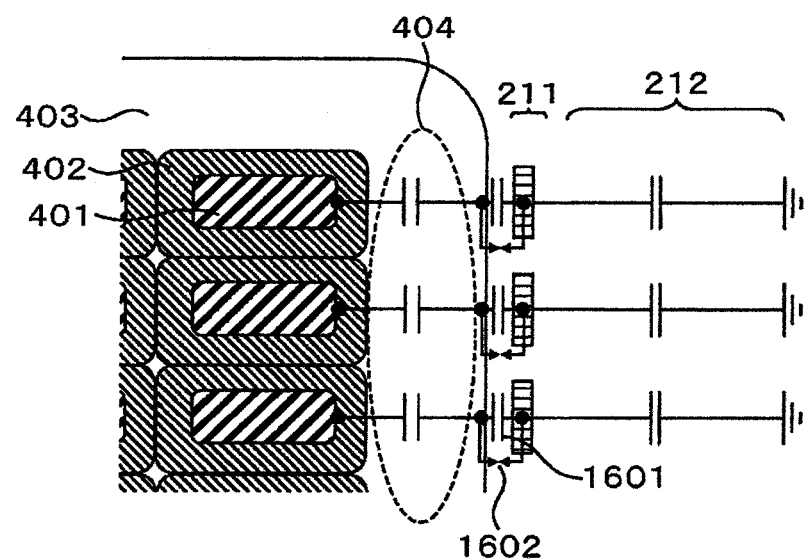
FIG. 16 is an enlarged fragmentally cross-sectional view illustrative of a gap between a foil electrode and an insulation layer in FIG. 4.

Consequently, as shown in FIG. 15 or 16, an air gap 1501 takes place between the coil series connection area insulation layer and the metal foil or an air gap 1601 takes place between the turn conductor portion and the metal foil. When a high voltage is applied to these air gap portions, the air gap undergoes instantly short circuit 1502 or 1602 (partial discharge), giving rise to a problem that the measurement voltage varies largely. Therefore, a voltage in excess of a partial discharge initiation start voltage should not be applied across coil conductor 301 and metal foil electrode 207 on the series connection area insulation layer or across conductor strand 401 and metal foil electrode 211 opposing the turn conductor. The partial discharge initiation voltage (PDIV) can be measured by connecting the high voltage power supply to the rotating electrical machine winding, by grounding the foil electrode, by increasing from 0V the voltage of high voltage power supply and by measuring a voltage at the time of generation of the partial discharge by means of the partial discharge measurement unit. Accordingly, an upper limit value of the series capacitors $C_x'$ must be determined such that a voltage in excess of (PDIV) measured in advance will not applied across the coil conductor 301 and the metal foil electrode 207 on series connection area insulation layer and across the metal foil electrode 211 and opposing turn conductor. The upper limit value of series capacitor $C_x'$ is given by $(PDIV) \cdot C_x / (V_{imp} - (PDIV))$. From the above, the effective range of series capacitor $C_x'$ is set as shown in FIG. 14. To add, in case the partial discharge initiation voltage (PDIV) of the insulation layer is higher than the impulse test voltage $V_{imp}$, any partial discharge is not generated by the test voltage in the insulation layers of coil conductor series connection area and coil turn conductor and in the air gap between electrode and insulation layer and thereafter, the upper limit shown in FIG. 14 does not exist.

[Embodiment 2]

In embodiment 1, all the electrodes are laid on one side surface of the coil insulation layer. But, since conductor strands in 2 rows in the coil conductor are at the same potential, series capacitors 1205 can respectively be applied to metal foil electrodes 1201 on one side to confront odd-line conductors in the coil insulation layer and series capacitors 1206 can respectively be applied to the metal foil electrodes 1202 on the opposite side to confront the even-line conductors in the coil insulation layer. In this manner, the distance between the metal foil electrodes can be increased and erroneous contact and discharge across the adjacent metal foil electrodes can be prevented.

[Embodiment 3]

Figure 8:
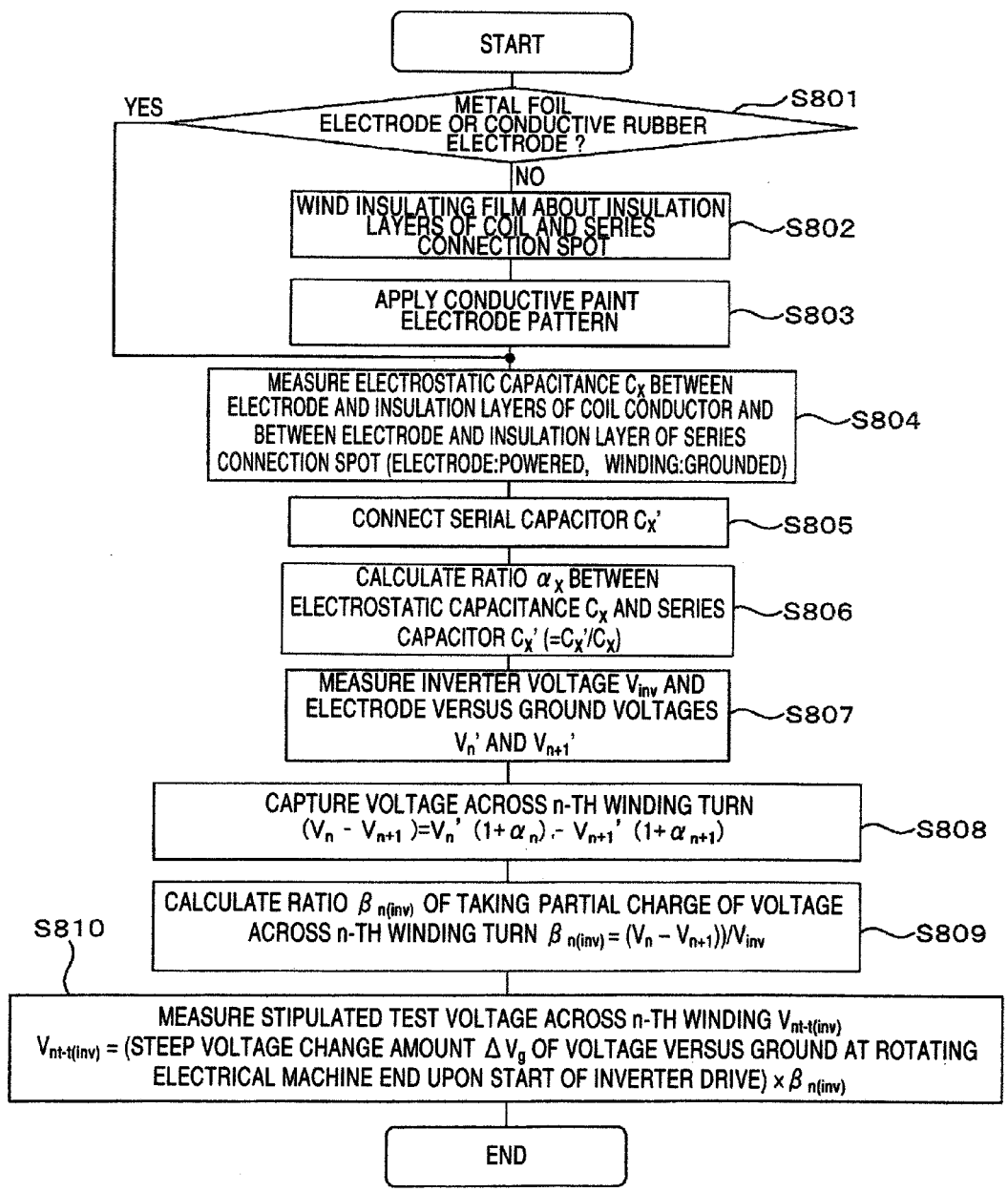
FIG. 8 is a flowchart of a method for capturing a stipulated test voltage to be applied across an n-th winding turn.
Figure 13:
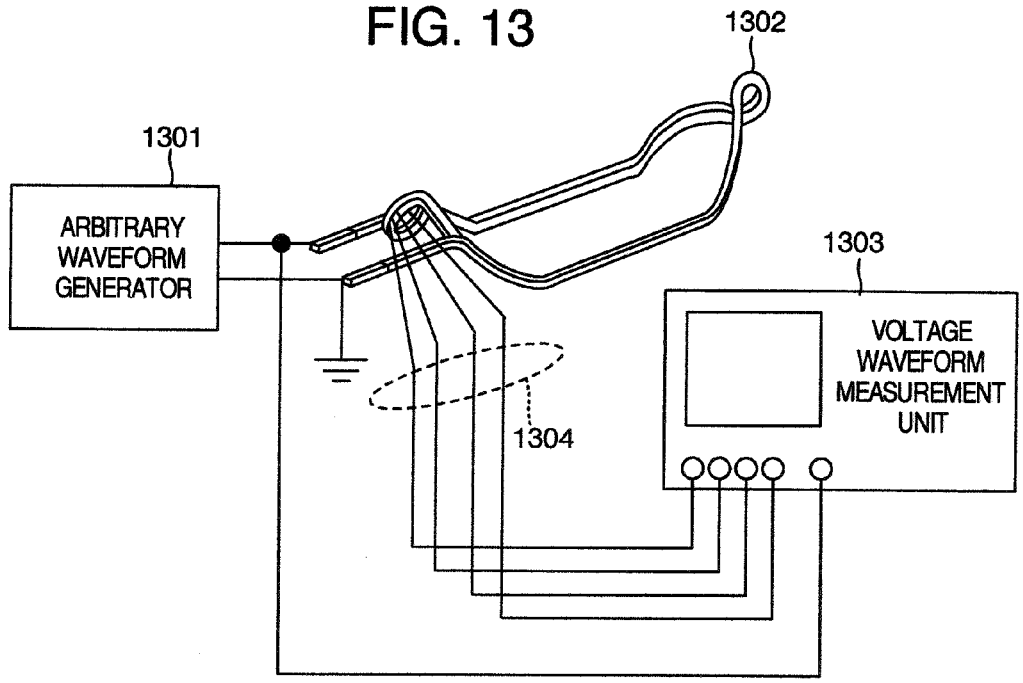
FIG. 13 is a diagram schematically illustrative of a method for measuring a distribution of voltages across a winding turn in a coil according to embodiment 3 of the invention.

In embodiment 2, the metal foil electrodes are applied to both the insulation layers of coil conductor series connection area and of coil turn conductor as shown in FIG. 2. But, when the size of coil is small, it is difficult to apply the metal foil electrodes to both the insulation layers of coil conductor series connection area and coil turn conductor. In embodiment 3, countermeasures against such difficulties are taken. More particularly, the metal foil electrode is attached to only the coil conductor series connection area in FIG. 2 and then, a coil taking partial charge of voltage waveform developing across the start and end of coil winding is determined. The waveform of voltage shared by the coil and generated across the start and the end of coil winding is outputted to an arbitrary waveform generator 1301 as shown in FIG. 13 and is applied to the rotating electrical machine coil 1302, a voltage across a winding turn is measured by a voltage waveform measurement unit 1303 by way of a voltage distribution measurement electrode 1304 and the rate of taking partial charge of the voltage across winding turns $\beta_{n\ (imp)}$ and $\beta_{n\ (inv)}$ explained in connection with FIGS. 7 and 8 is determined. In the present method, the insulation layer of coil is removed and a voltage directly across coil turn is measured by means of the voltage distribution measurement electrode 1304 but a coil manufactured independently of the rotating electrical machine in the course of the same manufacture process as that of the rotating electrical machine can be used for measurement and therefore, the shipment product will not be damaged.

COMPARATIVE EXAMPLE

Figure 9:
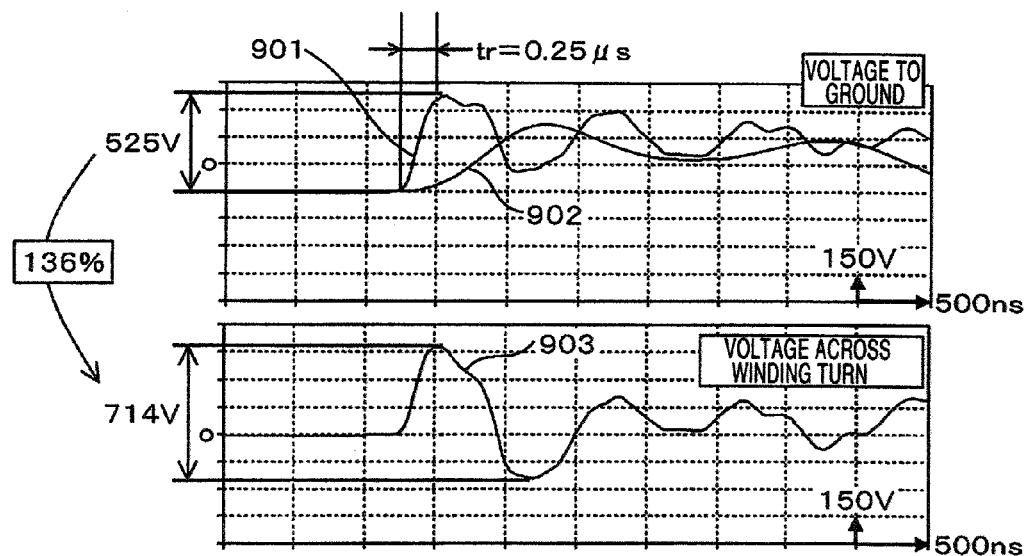
FIG. 9 is a graphic representation illustrative of a voltage across a winding turn which develops when an inverter voltage is applied.

Turning to FIG. 9, an example of a grounding voltage under the application of an inverter voltage to the rotating electrical machine and a waveform of a voltage consequently generated across a winding turn are graphically illustrated. With an inverter used in example 1, an inverter voltage 901 having a voltage rise-up time tr=0.25 µs is applied to the rotating electrical machine. This voltage propagates through the machine winding, thus generating an inverter voltage 902. A voltage 903 across a winding turn during inverter voltage loading which represents a difference between those voltages is generated across the winding turn.

A voltage having a magnitude which is 136% of that of a grounding voltage applied to the terminal of rotating electrical machine develops across the winding turn.

Figure 10:
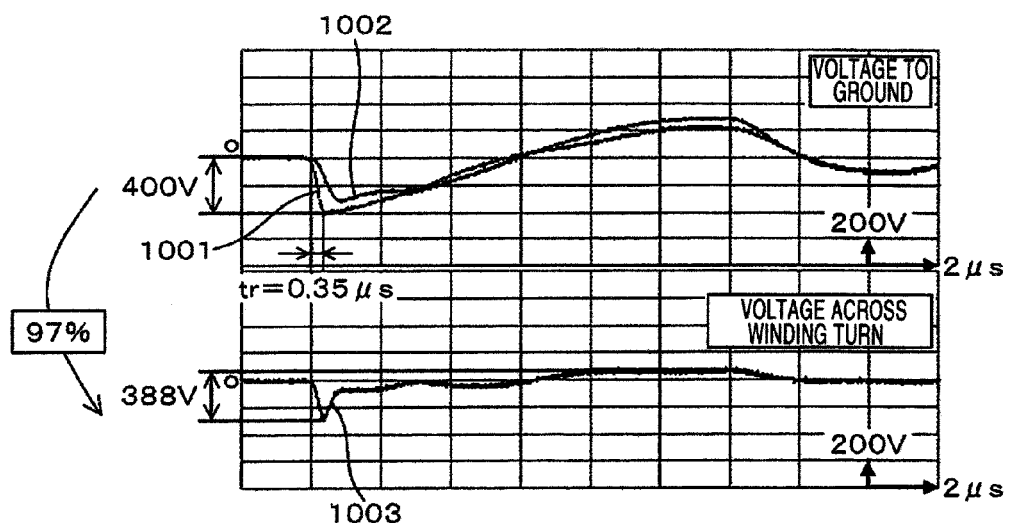
FIG. 10 is a graphic representation illustrative of an impulse voltage waveform and a voltage across a winding turn when a rotating electrical machine is connected.

On the other hand, in example 2, a voltage across a winding turn is measured by connecting to the rotating electrical machine an impulse power supply capable of generating under no load an impulse voltage having the same voltage rise-up time tr=0.25 μs as that of the sophisticated inverter voltage waveform. Measurement results are shown in FIG. 10. The voltage rise-up time tr an impulse voltage 1001 applied to the rotating electrical machine has changes to 0.30 μs (it is to be noted, however that a power supply of negative polarity impulse is used herein). Further, it will be seen that a voltage of only 97% of a steep voltage applied across the winding turn is generated. In this manner, even when a voltage having the same voltage rise-up time as that of an inverter voltage is desired to be applied to the rotating electrical machine, a problem of changing voltage rise-up time is encountered in general.

Figure 11:
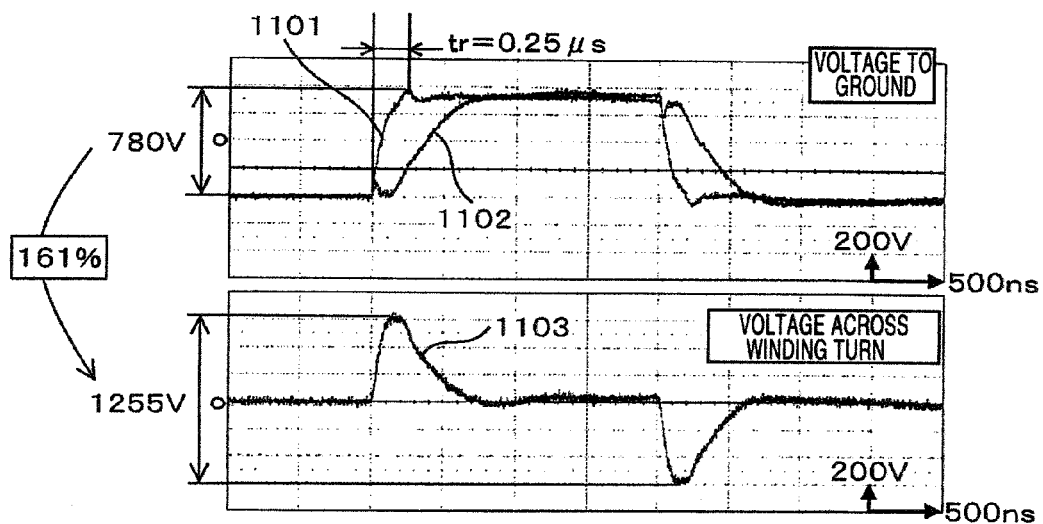
FIG. 11 is a graphic representation illustrative of an impulse voltage waveform and a voltage across a winding turn when an impulse power supply is connected which can materialize the same voltage rise-up time as that by the inverter at the time of connection of the rotating electrical machine.
Figure 12:
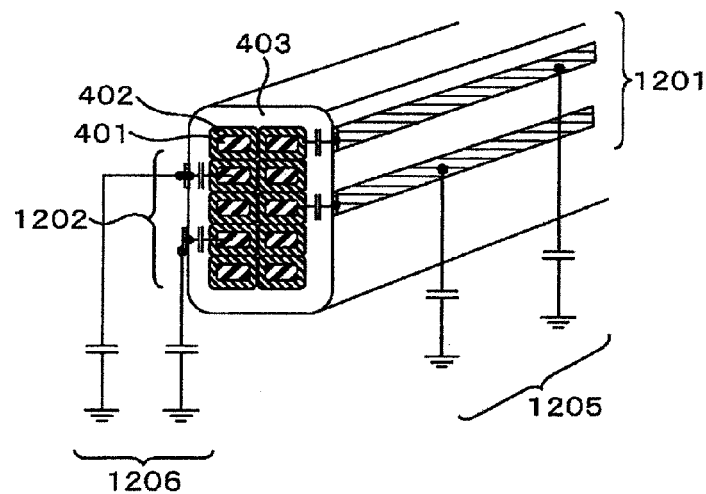
FIG. 12 is a fragmentary perspective cross-sectional view illustrative of layout of electrodes according to embodiment 2 of the invention.

Thus, subsequently, an impulse power supply capable of applying an impulse voltage of tr=0.25 μs even when the rotating electrical machine is connected was studied and examined. The results are shown in FIG. 11. The output waveform of the impulse power supply was a rectangular waveform. As shown in the figure, an impulse voltage 1101 of a voltage rise-up time tr=0.25 μs is applied to the rotating electrical machine. This voltage propagates through the machine winding to generate an impulse voltage 1102. A voltage 1103 representing the difference between them is generated across a winding turn. Incidentally, in spite of the fact that the voltage rise-up time of impulse voltage is made equal to that of the inverter voltage 901 at the end of rotating electrical machine, a voltage of 161% of a steep voltage applied across the winding turn is generated and with the power supply of FIG. 11 used, a voltage larger than that in the case of FIG. 9 is generated. Namely, when it is presumed that the rotating electrical machine is a black box and a voltage of the same voltage rise-up time as that of an inverter voltage is merely applied from external, the same voltage as that generated across a winding turn upon start of inverter drive cannot be generated and a partial discharge across the winding turn cannot be measured correctly.

As a result of earnest study of the above phenomenon, it has be proven that the conventional measurement of partial discharge across an impulse voltage winding turn in which a steep voltage of the same voltage rise-up time as that of an inverter voltage is applied from external is difficult to correctly measure the partial discharge across the winding turn of the inverter driven rotating electrical machine. Further, through the manufacture process including the above test method, a rotating electrical machine suitable for inverter drive is difficult to provide.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A method of testing impulse partial discharges in a rotating electrical machine comprising the steps of:
    placing electrodes on the surface of an insulation layer of a coil conductor series connection area of a coil of the rotating electrical machine, or to the surface of an insulation layer of a coil turn conductor of a coil of a winding of the rotating electrical machine;
    measuring a waveform of grounding voltage of the coil turn conductor through the medium with an electrostatic capacitance ($C_x$) of the insulation layer of the coil conductor series connection area, or of the insulation layer of the coil turn conductor; and
    measuring a partial discharge, while measuring a voltage developing in the coil or across a winding turn in the coil, from a change in a waveform of the grounding voltage,
    wherein a capacitor is connected in series with ground and with the insulation layer of the coil conductor series connection area, or the capacitor is connected in series with ground and with the insulation layer of the coil turn conductor;
    wherein a measurement is made of a grounding voltage waveform applied across the capacitor;
    wherein the measured grounding voltage waveform is converted to a grounding voltage waveform applied to the winding, by using a voltage division ratio determined from a separately measured ratio ($\alpha_x$) between the electrostatic capacitance ($C_x$) of insulation layer and the electrostatic capacitance ($C_x'$) of the capacitor; and
    wherein a partial discharge is measured from a change in the converted grounding voltage waveform, while measuring a voltage applied to the coil and across a winding turn in the coil.

2. The method of testing impulse partial discharge in the rotating electrical machine according to claim 1,
    wherein an electrostatic capacitance of each of a first set of capacitors ($C_1', C_2' \ldots$ or $C_n'$) has a constant ratio ($\alpha$) to an electrostatic capacitance of a first respective insulation layer ($C_1, C_2, \ldots$ or $C_n$), each of which is an insulation layer of the coil conductor series connection area in the rotating electrical machine winding, and wherein each of the first set of capacitors is connected in series with ground and with an electrode applied to the surface of its first respective insulation layer;
    wherein an electric capacitance each of a second set of capacitors ($C_{12}', C_{13}' \ldots$ or $C_{15}'$) has a constant ratio ($\alpha$) to an electrostatic capacitance of a second respective insulation layer ($C_{12}, C_{13}, \ldots$ or $C_{15}$), which is an insulation layer of the coil turn conductor, and wherein each of the second set of capacitors is connected in series with ground and with an electrode applied to the surface of its second respective insulation layer;
    wherein voltages generated in the coil and across a winding turn in the coil are determined from a difference between waveforms of grounding voltages generated in the electrostatic capacitance ($C_1', C_2' \ldots C_n'$) and from the constant ratio ($\alpha$); and
    wherein a partial discharge is measured while measuring the difference between waveforms of grounding voltages.

3. The method of testing impulse partial discharge in the rotating electrical machine according to claim 1,
    wherein an electrostatic capacitance ($C_1', C_2' \ldots$ or $C_n'$) of each of a first set of capacitors has a constant ratio ($\alpha$) to an electrostatic capacitance ($C_1, C_2, \ldots$ or $C_n$) of a first respective insulation layer, which is an insulation layer of the coil conductor series connection area in the rotating electrical machine winding, and wherein each of the first set of capacitors is connected in series with ground and with an electrode applied to the surface of its first respective insulation layer;

wherein an electric capacitance ($C_{12}'$, $C_{13}'$ ... or $C_{15}'$) of a capacitor has a constant ratio ($\alpha$) to an electrostatic capacitance ($C_{12}$, $C_{13}$, ... or $C_{15}$) of a second respective insulation layer, which is an insulation layer of the coil turn conductor, and wherein each of the second set of capacitors is connected in series with ground and with an electrode applied to the surface of its second respective insulation layer;

wherein voltages generated in the coil and across a winding turn in the coil are determined from a difference between waveforms of grounding voltages generated in the electrostatic capacitance ($C_1'$, $C_2'$, ... $C_n'$); and wherein a partial discharge is measured while measuring said voltages.

4. A method of testing impulse partial discharges in a rotating electrical machine comprising the steps of:

placing electrodes on the surface of an insulation layer of a coil conductor series connection area of a coil of the rotating electrical machine, or to the surface of an insulation layer of a coil turn conductor of a coil of a winding of the rotating electrical machine;

measuring a waveform of grounding voltage of the coil turn conductor through the medium with an electrostatic capacitance ($C_x$) of the insulation layer of the coil conductor series connection area, or of the insulation layer of the coil turn conductor; and measuring a partial discharge, while measuring a voltage developing in the coil or across a winding turn in the coil, from a change in a waveform of the grounding voltage, wherein on the basis of measurement results, a magnitude of an impulse test voltage corresponding to a voltage across a predetermined winding turn is determined to thereby measure a partial discharge, wherein a capacitor is connected in series with ground and with the insulation layer of the coil conductor series connection area, or the capacitor is connected in series with ground and with the insulation layer of the coil turn conductor;

wherein a measurement is made of a grounding voltage waveform applied across the capacitor;

wherein the measured grounding voltage waveform is converted to a grounding voltage waveform applied to the winding, by using a voltage division ratio determined from a separately measured ratio ($\alpha_x$) between the electrostatic capacitance ($C_x$) of insulation layer and the electrostatic capacitance ($C_x'$) of the capacitor; and wherein a voltage applied to the coil and across a winding turn in the coil is measured from a change in the converted grounding voltage waveform, and on the basis of the results of the measurements, a magnitude of an impulse test voltage corresponding to a voltage across a predetermined winding turn is determined to thereby measure a partial discharge.

5. A method of testing impulse partial discharges in a rotating electrical machine comprising the steps of:

placing electrodes on the surface of an insulation layer of a coil conductor series connection area of a coil of the rotating electrical machine, or to the surface of an insulation layer of a coil turn conductor of a coil of a winding of the rotating electrical machine;

measuring a waveform of grounding voltage of the coil turn conductor through the medium with an electrostatic capacitance ($C_x$) of the insulation layer of the coil conductor series connection area, or of the insulation layer of the coil turn conductor; and measuring a partial discharge, while measuring a voltage developing in the coil or across a winding turn in the coil, from a change in a waveform of the grounding voltage, wherein an electrostatic capacitance ($C_1'$ ..., or $C_{12}'$ ...) of the capacitor connected between ground and with a first respective insulation layer, which is an insulation layer of the coil conductor series connection area, or between ground and with a second respective insulation layer, which is an insulation layer of the coil turn conductor, is at least 10 times of a stray capacitance of a voltage measurement probe, and corresponds to ($C_x'$) of the following formula:

$$C_x' < (PDIV) \cdot C_x / (V_{imp} - (PDIV));$$

wherein partial discharge initiation voltage (PDIV) represents when an electrode is applied to the surface of insulation layer of the coil conductor series connection area, or electrodes are applied to the surface of insulation layer of the coil turn conductor.

* * * * *